United States Patent [19]

Gross

[11] 4,241,408
[45] Dec. 23, 1980

[54] HIGH RESOLUTION FRACTIONAL DIVIDER

[75] Inventor: Glenn M. Gross, Chicago, Ill.

[73] Assignee: Norlin Industries, Inc., Deerfield, Ill.

[21] Appl. No.: 26,953

[22] Filed: Apr. 4, 1979

[51] Int. Cl.³ .......................... G06F 7/68; H03K 21/36
[52] U.S. Cl. .............................. 364/703; 84/DIG. 11;
307/271; 328/41; 328/48
[58] Field of Search ................ 364/701, 703; 307/271;
328/39, 41, 46, 48; 84/1.01, DIG. 11

[56] References Cited

U.S. PATENT DOCUMENTS

| | | | |
|---|---|---|---|
| 3,230,352 | 1/1966 | Grondin et al. | 364/703 |
| 3,818,354 | 6/1974 | Tomisawa et al. | 328/41 |
| 3,828,109 | 8/1974 | Morez | 84/1.01 |
| 3,976,945 | 8/1976 | Cox | 328/48 X |
| 3,976,946 | 8/1976 | Schröder | 328/39 |
| 4,053,739 | 10/1977 | Miller et al. | 328/39 X |

Primary Examiner—Jerry Smith
Attorney, Agent, or Firm—Ronald J. Kransdorf; Jack Kail

[57] ABSTRACT

A high resolution fractional divider is responsive to a multi-bit divisor representative control word and a clock signal for developing an output signal having an average frequency of the form n-f, wherein n is an integer determined according to the most significant bits of the control word and f is a fraction determined according to the least significant bits of the control word.

5 Claims, 4 Drawing Figures

HIGH RESOLUTION FRACTIONAL DIVIDER

BACKGROUND OF THE INVENTION

The present invention relates generally to the field of frequency dividers and, more particularly, to a frequency divider capable of high resolution, fractional division.

Programmable frequency dividers capable of integral division are well known in the art. Such dividers typically comprise a counter, e.g. a down counter, having a control input for receiving a binary control word and a clock input for receiving a high frequency clock signal. The down counter is repetitively loaded with the control word and operated at a rate set by the clock signal wherein an output pulse is developed each time a zero count is attained. Thus, in effect, the output pulses form a signal whose frequency represents the quotient of a division operation wherein the repetition rate of the clock signal represents the dividend and the value of the binary control word represents the divisor. Due to the nature of such dividers, only integral division may be achieved wherein the quotient represented by the frequency of the output signal corresponds to an integer value.

In various applications, it is desirable to effect a division operation having a relatively high degree of resolution. For example, circuits such as programmable filters, waveshapers and the like are typically operative in response to a high resolution pulse code which is often developed at the output of a conventional programmable divider. A number of circuits exemplary of the foregoing are disclosed in co-pending application, Ser. No. 835,695, filed Sept. 22, 1977, now U.S. Pat. No. 4,186,643, and entitled "Programmable Circuits for Electronic Musical Instruments". In order to achieve the high degree of resolution needed to properly operate the programmable circuits, the clock signal supplied to the divider is necessarily characterized by a relatively high repetition rate. That is, increasing the repetition rate of the clock signal supplied to the divider proportionately increases the resolution of the frequency characterizing the output signal while decreasing the repetition rate of the clock signal reduces the resolution of the frequency characterizing the output signal. Thus, theoretically, an output signal may be generated exhibiting any desired degree of resolution by simply providing a clock signal having a sufficiently high repetition rate. However, this approach to achieving high resolution rapidly become impracticable due to the frequency limitations characterizing state of the art integrated circuits. Currently available large scale integrated circuits, for example, have an operational range limited to about 4 MHz. As a result, resolution must often be sacrificed to accommodate the use of a clock signal having a repetition rate compatible with state of the art integrated circuit technology.

SUMMARY OF THE INVENTION

It is therefore a basic object of the present invention to provide an improved frequency divider circuit capable of achieving a high degree of resolution while operating in response to a clock signal having a repetition rate compatible with state of the art integrated circuit technology.

The foregoing is realized by the circuit of the invention which, in contradistinction to the integral type of frequency dividers of the prior art is capable of generating an output signal having an average frequency including fractional parts. The use of fractional parts to characterize the average frequency of the signal developed at the output of the divider allows high resolution standards to be attained while operating the divider in response to a clock signal having a practical repetition rate. In its most general sense, the high resolution fractional divider of the invention comprises means for generating a clock signal, means for selectively developing a divisor representative multi-bit control word including a group of most significant bits and a group of least significant bits and a divider means for developing an output signal having a frequency alternating between first and second integral values determined according to the group of most significant bits and for respective time periods determined according to the group of least significant bits.

In a first embodiment, the divider means comprises a conventional programmable divider and means for coupling a signal to the control input of the divider, which signal alternately comprises the group of most significant bits and the group of most significant bits incremented by a factor of unity for respective time periods determined according to the group of least significant bits. In a second embodiment, the divider means comprises a conventional programmable divider operated in response to the group of most significant bits and a modified clock signal formed by dropping individual pulses at spaced intervals from the unmodified clock signal at a rate determined by the group of least significant bits.

DESCRIPTION OF THE PREFERRED EMBODIMENT

Figure 1:
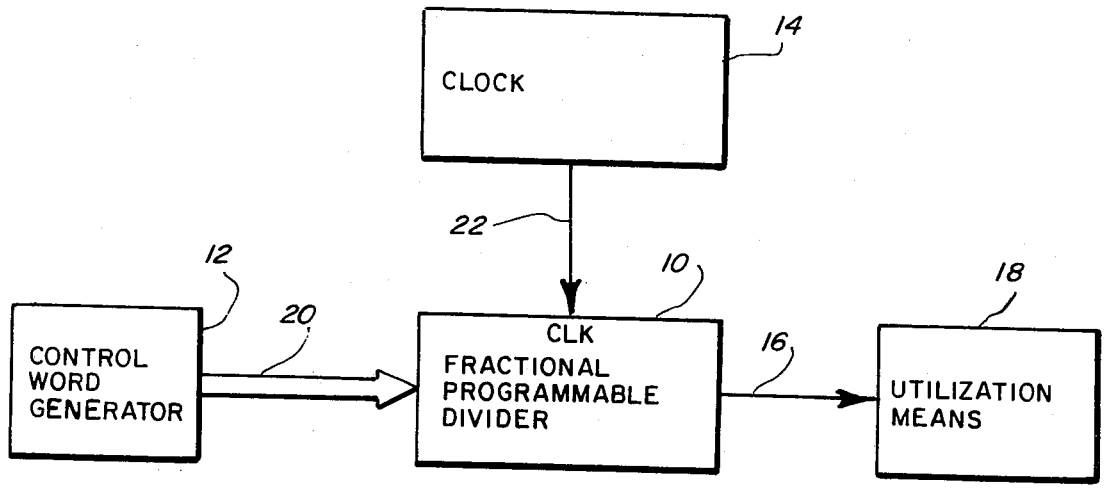
FIG. 1 is a block diagram generally illustrating the high resolution fractional divider of the invention.

Referring to FIG. 1, the fractional divider of the present invention is indicated generally by reference numeral 10. Fractional divider 10 is responsive to a control word generator 12 and to a clock 14 for developing a signal on output line 16 for controlling the operation of a utilization means 18.

More specifically, control word generator 12 is adapted for generating a divisor representative multi-bit control word on a multiple conductor bus 20 for application to the control input of fractional divider 10. Clock 14 couples a clock signal having a repetition rate of approximately 4 MHz over a cnductor 22 to the clock input of fractional divider 10. In response thereto, fractional divider 10 develops on line 16 an output signal having an average frequency representing the quotient of a division operation wherein the repetition rate of the clock signal represents the dividend and the value of the multi-bit control word represents the divisor. Significantly, the average frequency characterizing the signal developed on line 16 and representing the previously mentioned quotient may include fractional parts enabling the use of a clock signal having a practical repetition rate while maintaining a high degree of resolution.

Control word generator 12 may comprise any of a number of well-known circuits capable of generating a multi-bit binary word adapted for representing the divisor in a division operation. For example, although not to be limited thereto, control word generator 12 may comprise a multi-stage binary counter operated in response to a suitable clock signal. The multiple conductors comprising bus 20 are connected to the outputs of the individual stages of the counter such that a gradually increasing or decreasing multi-bit control word is coupled to the control input of fractional divider 10. Utilization means 18 may similarly comprise any of a number of well-known circuits. These circuits, such as programmable filters, waveshapers and the like, are responsive to the average frequency of the signal developed on line 16 for performing a certain task.

Figure 2:
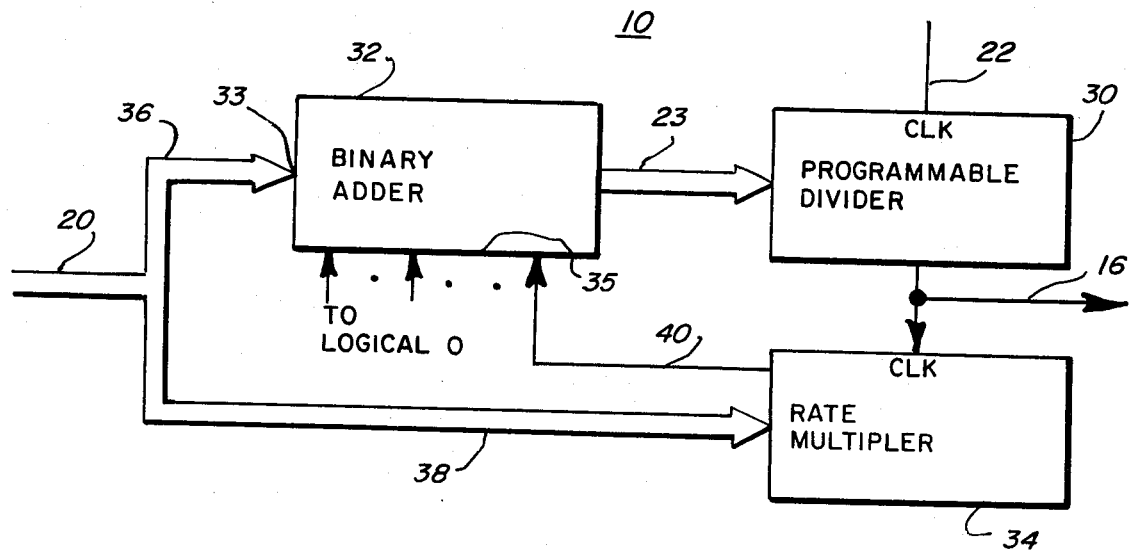
FIG. 2 is a detailed block diagram illustrating one embodiment of the high resolution fractional divider of the invention.

FIG. 2 illustrates one embodiment of the fractional programmable divider 10 illustrated generally in FIG. 1. Fractional programmable divider 10 comprises a conventional programmable divider 30 having a clock input connected for receiving the clock signal developed on conductor 22 and a control input coupled to the output of a binary adder 32 by a bus 23. The output of programmable divider 30, comprising also the output 16 of fractional divider 10, is coupled to the clock input of a rate multiplier 34. The multiple conductors forming bus 20 are divided into a pair of groups forming a bus 36 coupled to a first multiple input port 33 of binary adder 32 and a second bus 38 coupled to the program inputs of rate multiplier 34. The separation of the conductors forming bus 20 is effected such that the most significant bits of the control word generated by control word generator 12 are developed on bus 36 while the least significant bits of the control word are developed on bus 38. The output of rate multiplier 34 is developed on a conductor 40 and coupled to the least significant input of a second multiple input port 35 of binary adder 32. The remaining inputs of the second input port are connected to a source of logical 0 signal level.

For exemplary purposes, bus 20 may be considered to comprise sixteen individual conductors for coupling a sixteen bit control word from generator 12 to a fractional divider 10. Bus 36 comprises eight of these conductors for coupling the eight most significant bits of the sixteen-bit control word to the eight individual inputs of input port 33 of binary adder 32. The remaining eight conductors form bus 38 which couples the eight least significant bits of the sixteen-bit control word to the eight program inputs of rate multiplier 34.

In operation, the output of rate multiplier 34 developed on conductor 40 is initially logical 0 so that the output of binary adder 32 corresponds to the eight most significant bits of the control word coupled to input port 33 by bus 36. The eight most significant bits of the control word are thereby coupled to the control input of programmable divider 30 which, in turn, develops a signal on output line 16 having a frequency corresponding to the repetition rate of the clock signal divided by the value of the binary signal represented by the eight most significant bits of the control word. Rate multiplier 34 is responsive to the signal developed on output line 16 and to the eight least significant bits of the control word for developing an output pulsating signal on conductor 40 having a repetition rate proportional to the frequency of the signal developed on output 16 as well as to the value of the binary signal represented by the eight least significant bits of the control word. In particular, assuming that rate multiplier 34 is an eight-bit device, the output signal developed on conductor 40 has the form $f_i$ (N/256), where $f_i$ represents the frequency of the signal developed on line 16 and N represents the value of the eight least significant bits of the control word. In this case, the maximum value of N is 255.

Each pulse developed at the output 40 of rate multiplier 34 results in a logic signal 00000001 being coupled to port 35 of binary adder 32. Consequently, the value of the output signal developed by a binary adder 32 is increased by one thereby increasing by one the value of the signal supplied to the control input of programmable divider 30. This, in effect, increases by one the divisor of the division operation performed by programmable divider 30 whereby the frequency of the output signal developed on line 16 decreases to its next lowest step. The proportion of time during which the frequency of the output signal is at the lower frequency is determined by the repetition rate of the pulses developed at the output of rate multiplier 34. This repetition rate is, in turn, directly dependent upon the value of the eight least significant bits of the control word which are coupled to the program inputs of the rate multiplier. Thus, as the value of the number represented by the eight least significant bits of the control word increases, the repetition rate of the pulses developed on conductor 40 increases proportionately and the frequency of the signal developed on output 16 will spend a proportionately larger amount of time at the lower frequency. Similarly, as the value of the number represented by the eight least significant bits of the control word decreases, the repetition rate of the signal developed on conductor 40 decreases proportionately and the signal developed on output line 16 spends a proportionately smaller amount of time at the lower frequency.

It will thus be seen that the frequency of the signal developed on output line 16 alternates between a first value determined according to the value of the number represented by the eight most significant bits of the control word and a second value also determined according to the number represented by the value of the eight most significant bits of the control word but incremented by a factor of unity. The respective periods of time during which the frequency of the output signal is characterized by the first and second values is determined by the value of the number represented by the eight least significant bits of the control word. Over a number of cycles of the clock signal, the output signal developed on line 16 therefore takes on an effective average frequency having a value falling between the first and second values. More precisely, the average frequency of the output signal is defined by the relationship $F_i[M+(L/256)]$ where $F_i$ represents the repetition rate of the clock signal developed on conductor 22, M represents the value of the eight most significant bits of the control word and L represents the value of the eight least significant bits of the control word. The frequency of the output signal is therefore composed of an integer value determined according to the eight most significant bits of the control word and a fractional value determined according to the eight least significant bits of the control word.

Figure 3:
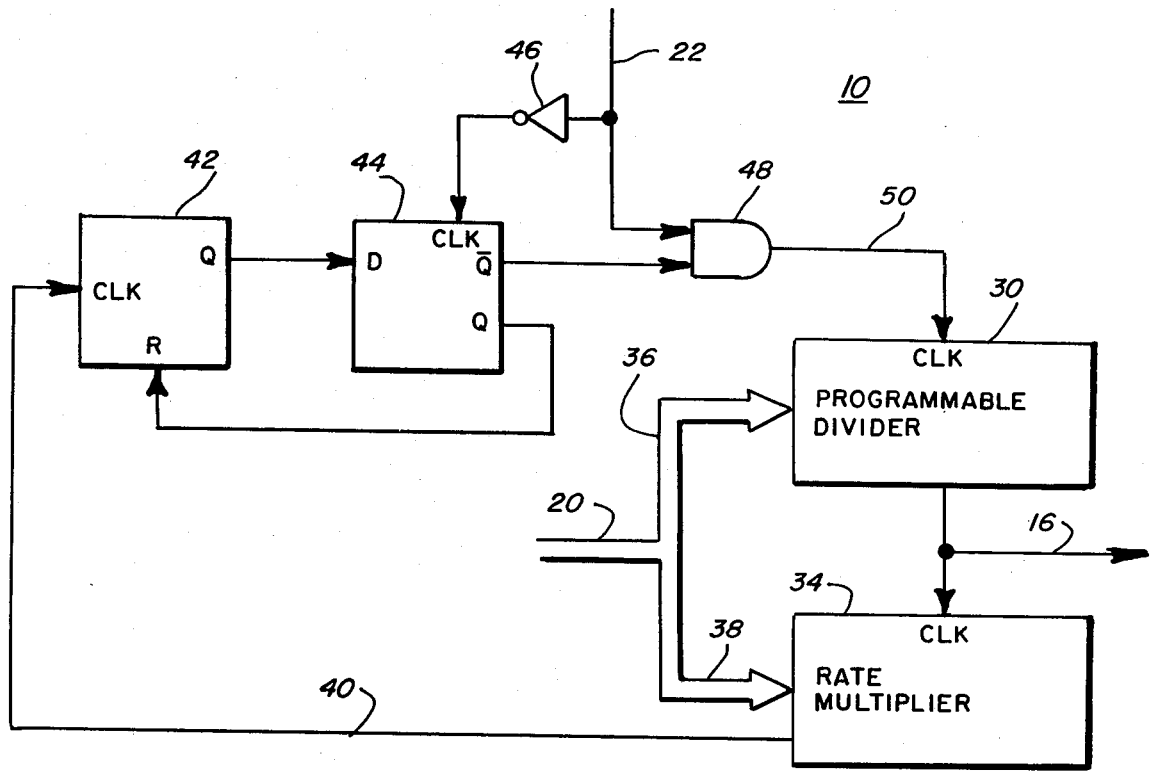
FIG. 3 is a detailed block diagram illustrating another embodiment of the high resolution fractional divider of the invention.

FIG. 3 shows another embodiment of the high resolution fractional divider 10 of the invention. As in the embodiment of FIG. 2, a signal is developed on output line 16 alternating between two integral values determined in accordance with the most significant bits of the control word and at a rate determined in accordance with the least significant bits of the control word. As a result, the signal developed on line 16 has an effective average frequency over a number of cycles composed of an integer part and a fractional part for providing high resolution while allowing for the use of a clock signal having a practical repetition rate. While such is achieved in the circuit of FIG. 2 by suitably varying the divisor representative signal supplied to the control input of programmable divider 30, in FIG. 3 these results are realized by suitably modifying the dividend representative clock signal supplied to programmable divider 30 by dropping pulses therefrom at a controllable rate.

Referring more specifically to FIG. 3, bus 20 is again separated into two busses 36 and 38, bus 36 directly supplying the eight most significant bits of the control word to the control inputs of programmable divider 30 and bus 38 supplying the eight least significant bits of the control word to the program inputs of rate multiplier 34. The output 40 of rate multiplier 34 is coupled to the clock input of a toggle flip-flop 42, the Q output of flip-flop 42 being connected to the D input of a D-type flip-flop 44. The clock signal developed on conductor 22 is coupled to the first input of an AND gate 48 and through an inverter 46 to the clock input of flip-flop 44. The $\bar{Q}$ output of flip-flop 44 is coupled to the second input of AND gate 48 and the Q output of flip-flop 44 is connected back to the reset input of flip-flop 42. Finally, the output 50 of AND gate 48 is connected to the clock input of programmable divider 30.

Figure 4:
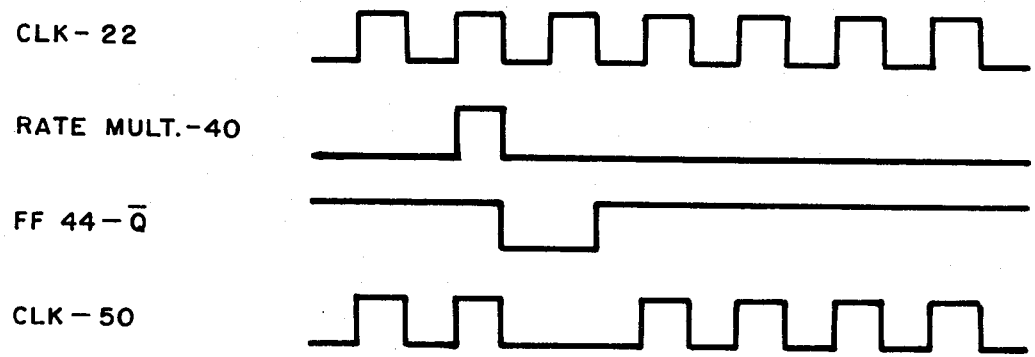
FIG. 4 is a graphical representation of a series of waveforms useful in explaining the operation of the circuit of FIG. 3.

Referring to FIG. 4, the rising edge of a pulse developed on output 40 of rate miltiplier 34 clocks flip-flop 42 placing its Q output at logical 1. On the next alternate phase of the clock signal developed on conductor 22 as represented by the output of inverter 46, the logical 1 Q output of flip-flop 42 is clocked into flip-flop 44 causing its $\bar{Q}$ output to go to logical 1, resetting flip-flop 42, and it Q output to logical 0. The next succeeding trailing edge of the clock signal developed on conductor 22 will therefore cause a logical 0 signal to be clocked into flip-flop 44 producing a logical 1 signal at its $\bar{Q}$ output and a logical 0 at its Q output. As a consequence, a negative going pulse, having a width equal to one period of the clock signal developed on conductor 22, is developed at the Q output of flip-flop 44 in response to each pulse developed at the output 40 of rate multiplier 34. This pulse is combined with the clock signal on conductor 22 by AND gate 48 which develops a modified clock signal on its output 50 consisting of the unmodified clock signal minus the one pulse coinciding with the negative going pulse developed at the $\bar{Q}$ output of flip-flop 44. It will be appreciated that the effect of so modifying the clock signal supplied to programmable divider 30 produces the same results as changing the value of the signal coupled to the control input of the divider by a factor of unity in response to the output of adder 32 in FIG. 2.

In particular, the output 16 of programmable divider 30 will have a frequency characterized by a first integer value during portions of the modified clock signal developed on conductor 50 conforming to the clock signal developed on conductor 22 and characterized by a second integer value during portions of the modified clock signal from which a pulse has been eliminated.

The proportion of time that the output signal developed on conductor 16 spends at the lower integer value is dependent upon the repetition rate of the signal developed on output 40 of rate multiplier 34 which, in turn, is directly dependent upon the value of the number represented by the eight least significant bits coupled to the program inputs of the rate multiplier by bus 38. As the value of this number increases, the frequency of the output signal on conductor 16 will spend a proportionately larger amount of time at the lower second integer frequency value and as its decreases, it will spend a proportionately larger amount of time at the higher first integer frequency value. Therefore, over a number of cycles, the effective average frequency of the output signal may be represented by the previously defined expression $F_i/[M+(L/256)]$.

While particular embodiments of the invention have been shown and described, it will be obvious to those skilled in the art that changes and modifications may be made without departing from the invention in its broader aspects. For example, it is within the scope of the invention to utilize programmable dividers or the like in lieu of the rate multipliers illustrated in FIGS. 2 and 3. The aim in the appended claims, therefore, is to cover all such changes and modifications as fall within the true spirit and scope of the invention.

I claim:

1. A high resolution fractional divider comprising:
    means for generating a clock signal;
    means for selectively developing a multibit control word comprising a group of most significant bits and a group of least significant bits;
    programmable divider means having a clock input, a divisor control input and an output developing an output signal;
    means coupling said most significant bits to said divisor control input and said clock signal to said clock input; and
    means developing a product signal chopped by said output signal and representing the expression $F_o(LSB/N)$, where $F_o$ represents the frequency of said output signal, N is a predetermined interger and LSB is an integer representing the value of said group of least significant bits, said product signal operating said coupling means for modifying one of the signals coupled to said two inputs of said programmable divider means for causing said output signal to be characterized by an average frequency comprising an integral part determined according to said most significant bits and a fractional part determined according to said least significant bits.

2. A high resolution fractional divider comprising:
    means for generating a clock signal;
    means for selectively developing a multibit control word comprising a group of most significant bits and a group of least significant bits;
    a programmable divider having a clock input, a divisor control input and an output developing an output signal;
    means for coupling said group of most significant bits to said divisor control input and said clock signal to said clock input; and
    a rate multiplier having a clock input connected for receiving said output signal, a program input connected for receiving said group of least significant bits and an output developing a product signal in response thereto, said product signal operating said coupling means for modifying one of the signals coupled to said two inputs of said programmable divider causing said output signal to be characterized by an average frequency comprising an integral part determined according to said most significant bits and a fractional part determined according to said least significant bits.

3. A high resolution fractional divider comprising:
means for generating a clock signal;
means for selectively developing a multibit control word comprising a group of most significant bits and a group of least significant bits;
a programmable divider having a clock input, a divisor control input and an output developing an output signal;
means coupling said clock signal to the clock input of said programmable divider;
rate multiplier means having a clock input connected for receiving said output signal, a program input connected for receiving said group of least significant bits and an output developing a product signal in response thereto, said product signal being chopped in response to said output signal;
means for developing a divisor control signal repetitively alternating between said group of most significant bits and said group of most significant bits incremented by a factor of unity for respective time periods determined according to said chopped product signal; and
means coupling said divisor control signal to the divisor control input of said programmable divider, whereby said output signal is characterized by a frequency comprising an integral part determined according to said group of most significant bits and a fractional part determined according to said group of said least significant bits.

4. A high resolution fractional divider according to claim 3 wherein said means for developing a divisor control signal comprises a binary adder having first and second multibit addend inputs and a sum output for developing said divisor control signal, said first addend input being connected for receiving said group of most significant bits and said second addend input being connected for receiving a signal having a value of unity in response to each pulse of said chopped product signal.

5. A high resolution fractional divider comprising:
means for generating a clock signal;
means for selectively developing a multibit control word comprising a group of most significant bits and a group of least significant bits;
a programmable divider having a clock input, a divisor control input and an output developing an output signal;
means coupling said group of most significant bits to the divisor control input of said programmable divider;
rate multiplier means having a clock input connected for receiving said output signal, a program input connected for receiving said group of least significant bits and an output developing a product signal in response thereto, said product signal being chopped by said output signal,
means responsive to the occurrence of each pulse of said chopped product signal for inhibiting the next occuring pulse of said clock signal for developing a modified clock signal; and
means coupling said modified clock signal to the clock input of said programmable divider, whereby said output signal is characterized by a frequency comprising an integral part determined according to said most significant bits and a fractional part determined according to said least significant bits.

* * * * *